(12) United States Patent
Yoshida et al.

(10) Patent No.: US 8,106,952 B2
(45) Date of Patent: Jan. 31, 2012

(54) IMAGING DEVICE UNIT AND IMAGING APPARATUS

(75) Inventors: Koji Yoshida, Chiba (JP); Kuniharu Uchikawa, Kanagawa (JP); Takeaki Kodama, Saitama (JP)

(73) Assignee: Sony Corporation, Tokyo (JP)

( * ) Notice: Subject to any disclaimer, the term of this patent is extended or adjusted under 35 U.S.C. 154(b) by 552 days.

(21) Appl. No.: 12/260,584

(22) Filed: Oct. 29, 2008

(65) Prior Publication Data

US 2009/0153684 A1 Jun. 18, 2009

(30) Foreign Application Priority Data

Dec. 14, 2007 (JP) ................................ 2007-323044

(51) Int. Cl.
*H04N 5/228* (2006.01)
*H04N 5/225* (2006.01)
(52) U.S. Cl. .................... 348/208.99; 348/374
(58) Field of Classification Search ............. 348/208.99, 348/374
See application file for complete search history.

(56) References Cited

U.S. PATENT DOCUMENTS

| | | | | |
|---|---|---|---|---|
| 7,402,802 B1 * | 7/2008 | Terre et al. | ..................... | 250/330 |
| 7,436,435 B2 * | 10/2008 | Wada | ......................... | 348/208.4 |
| 2003/0067544 A1 * | 4/2003 | Wada | ......................... | 348/208.7 |
| 2005/0134727 A1 * | 6/2005 | Teramoto et al. | ............. | 348/375 |
| 2006/0278810 A1 * | 12/2006 | Kobayashi et al. | ......... | 250/208.1 |
| 2007/0109747 A1 * | 5/2007 | Sengoku et al. | ............. | 361/714 |
| 2008/0218977 A1 * | 9/2008 | Reis et al. | ..................... | 361/711 |

FOREIGN PATENT DOCUMENTS

| | | |
|---|---|---|
| JP | 11-345956 | 12/1999 |
| JP | 2003-348394 | 12/2003 |
| JP | 2004-6564 | 1/2004 |
| JP | 2006-186483 | 7/2006 |
| JP | 2006-222501 | 8/2006 |
| JP | 2006-332894 | 12/2006 |
| JP | 2007-123403 | 5/2007 |

* cited by examiner

*Primary Examiner* — Lin Ye
*Assistant Examiner* — Amy Hsu
(74) *Attorney, Agent, or Firm* — Oblon, Spivak, McClelland, Maier & Neustadt, L.L.P.

(57) ABSTRACT

An imaging device unit includes: an imaging device having an imaging surface located on one side thereof in a width direction thereof and a rear surface located oppositely to the imaging surface; a heat radiating plate radiating heat generated in the imaging device, the heat radiating plate being arranged at the rear surface of the imaging device; and a signal processing substrate causing the imaging device to be operated. The heat radiating plate and the signal processing substrate are arranged oppositely to each other with a spacer being interposed therebetween and with a space portion being obtained therebetween.

7 Claims, 14 Drawing Sheets

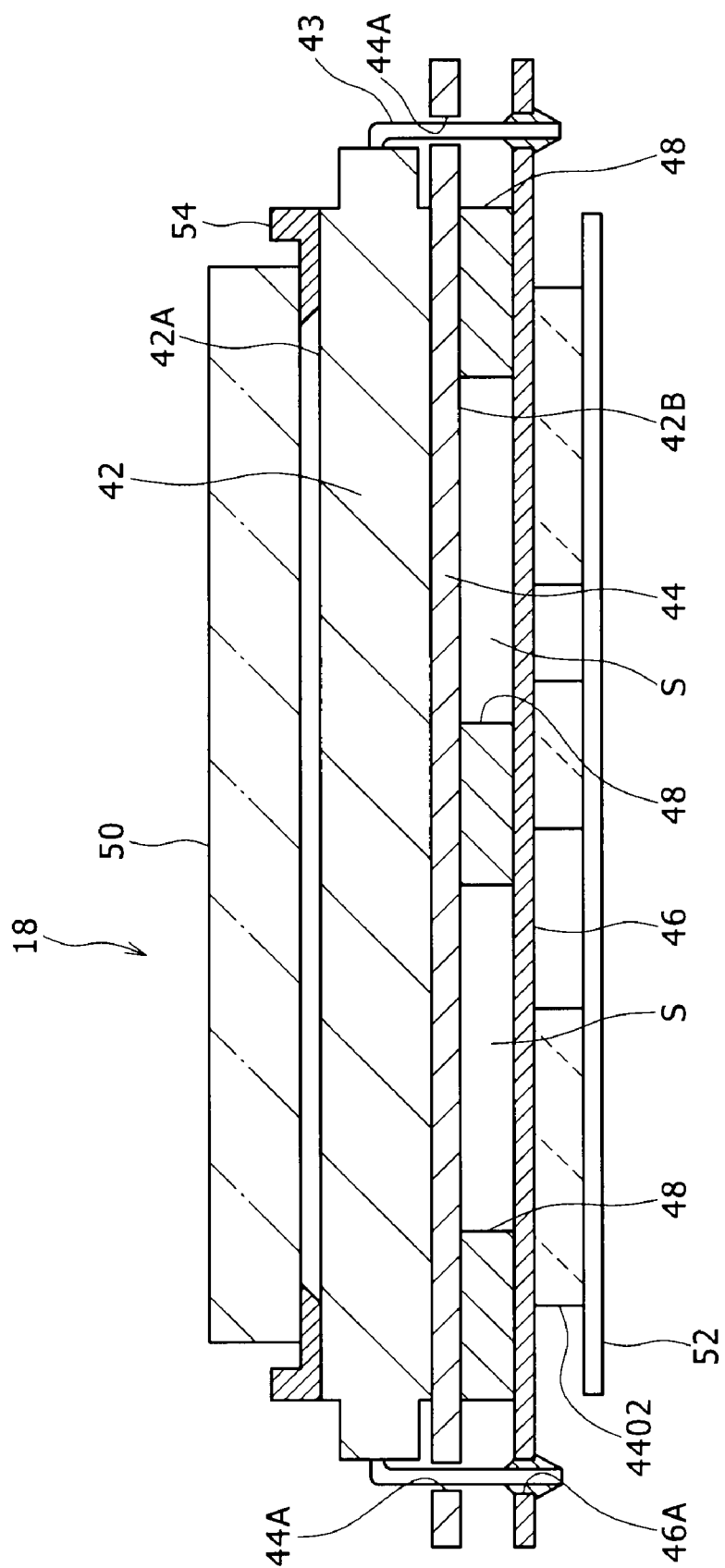

IMAGING DEVICE UNIT AND IMAGING APPARATUS

CROSS REFERENCES TO RELATED APPLICATIONS

The present invention contains subject matter related to Japanese Patent Application JP 2007-323044 filed in the Japanese Patent Office on Dec. 14, 2007, the entire contents of which being incorporated herein by reference.

BACKGROUND OF THE INVENTION (1) Field of the Invention

The present invention relates to an imaging device unit and an imaging apparatus.

(2) Description of the Related Art

An imaging apparatus, such as a digital still camera and the like, picks up the image of a subject, which has been led through an imaging optical system, by causing the image to be image-formed on an imaging device.

In many cases, a heat radiating plate which radiates heat generated in the imaging device is provided at a rear surface of the imaging device which is located oppositely to an imaging surface of the imaging device, and a signal processing substrate which operates the imaging device is provided on a surface of the heat radiating plate which is located oppositely to a surface of the heat radiating plate which faces the rear surface of the imaging device (Japanese Patent Application Laid-Open No. 2006-332894).

SUMMARY OF THE INVENTION

Meanwhile, in a case where the imaging apparatus calls for a continuous shooting capability and repeatedly performs a continuous imaging operation for a short time, as a single-lens reflex type imaging device does so, high heat is easy to be generated from the imaging device and the signal processing substrate.

In a case where the temperature of the imaging device exceeds the service temperature, the imaging device is hard to be stably operated, or noise components of a picked-up image signal generated in the imaging device are increased, so that it is necessary to forcedly stop the operation of the imaging device, which is disadvantageous in realizing an improvement in operability at the time of continuous shooting.

Therefore, how to effectively prevent an increase in the temperature of the imaging device is important.

However, in the related art, the heat generated in the signal processing substrate is transferred through the heat radiating plate to the imaging device, so that the related art is disadvantageous in realizing an improvement in a heat dissipating capability of the imaging device.

The present invention has been made in view of such a situation. It is desirable to provide an imaging device unit and an imaging apparatus which are advantageous in effectively preventing an increase in the temperature of the imaging device.

According to an embodiment of the present invention, there is provided an imaging device unit which includes an imaging device having an imaging surface located on one side thereof in a width direction thereof and a rear surface located oppositely to the imaging surface, a heat radiating plate radiating heat generated in the imaging device, the heat radiating plate being arranged at the rear surface of the imaging device, and a signal processing substrate causing the imaging device to be operated, the heat radiating plate and the signal processing substrate being arranged oppositely to each other with a spacer being interposed therebetween and with a space portion being obtained therebetween.

According to an embodiment of the present invention, there is provided an imaging apparatus which includes a housing, and an imaging device unit disposed within the housing, the imaging device unit including an imaging device having an imaging surface located on one side thereof in a width direction thereof, and a rear surface located oppositely to the imaging surface, a heat radiating plate radiating heat generated in the imaging device, the heat radiating plate being arranged at the rear surface of the imaging device, and a signal processing substrate causing the imaging device to be operated, the heat radiating plate and the signal processing substrate being arranged oppositely to each other with a spacer being interposed therebetween and with a space portion being obtained therebetween.

According to an embodiment of the present invention, the heat radiating plate provided at the rear surface of the imaging device, and the signal processing substrate are arranged oppositely to each other with the spacer being interposed therebetween and with the space portion being obtained therebetween, so that the layer of air present in the space portion exhibits thermal insulation effects and the heat of the signal processing substrate is prevented from being transferred directly to the imaging device through the heat radiating substrate, thus resulting in becoming advantageous in effectively preventing an increase in the temperature of the imaging device.

BRIEF DESCRIPTION OF THE DRAWINGS

Embodiments of the present invention will be described in detail based on the following figures, wherein:

FIG. 15 is a sectional view taken along line A-A of FIG. 8.

DETAILED DESCRIPTION OF THE PREFERRED EMBODIMENT

An embodiment of the present invention will be discussed hereinafter.

Figure 1:
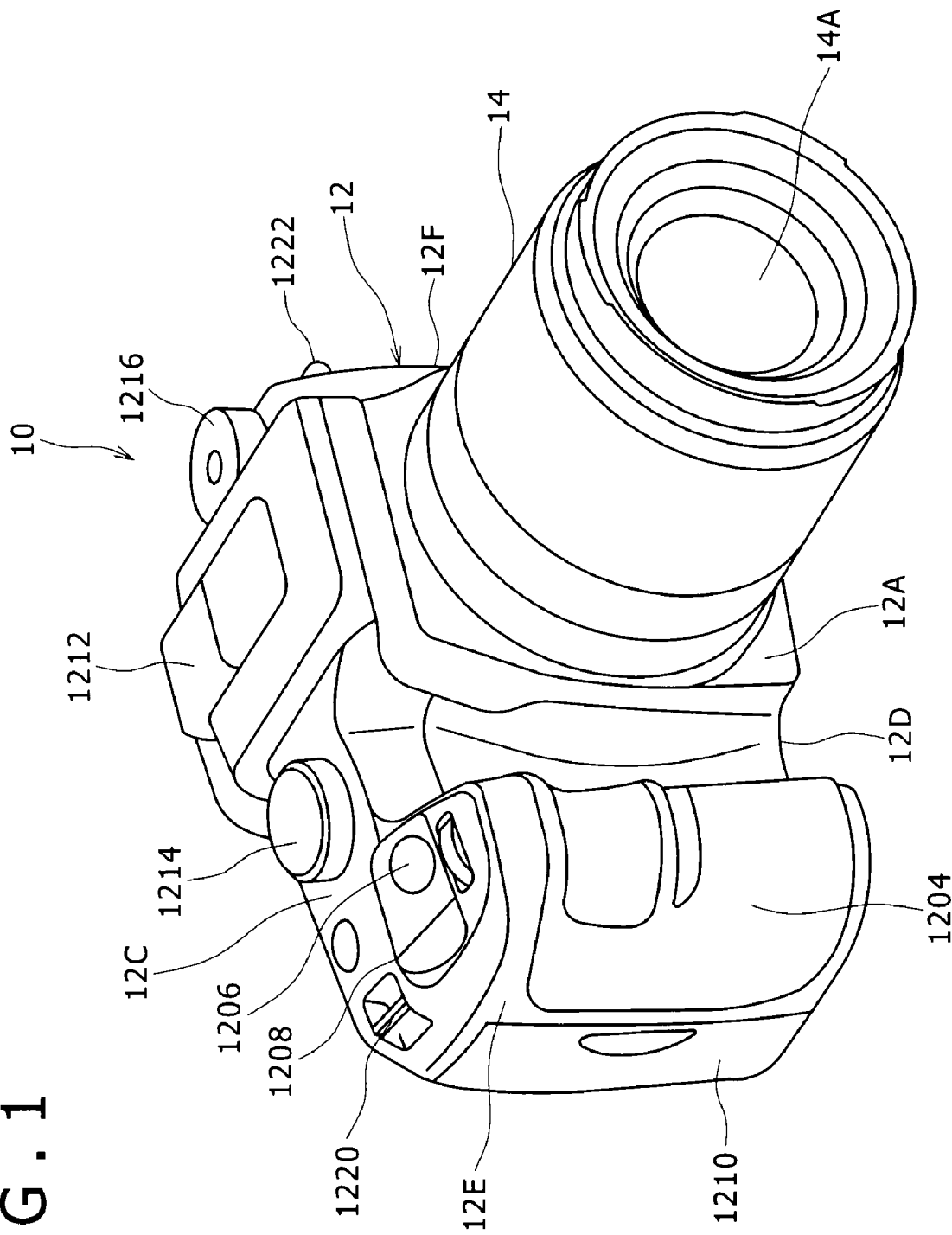
FIG. 1 is a perspective view of an imaging apparatus, to which an imaging device unit according to an embodiment of the present invention is applied, as viewed from a forward direction.
Figure 2:
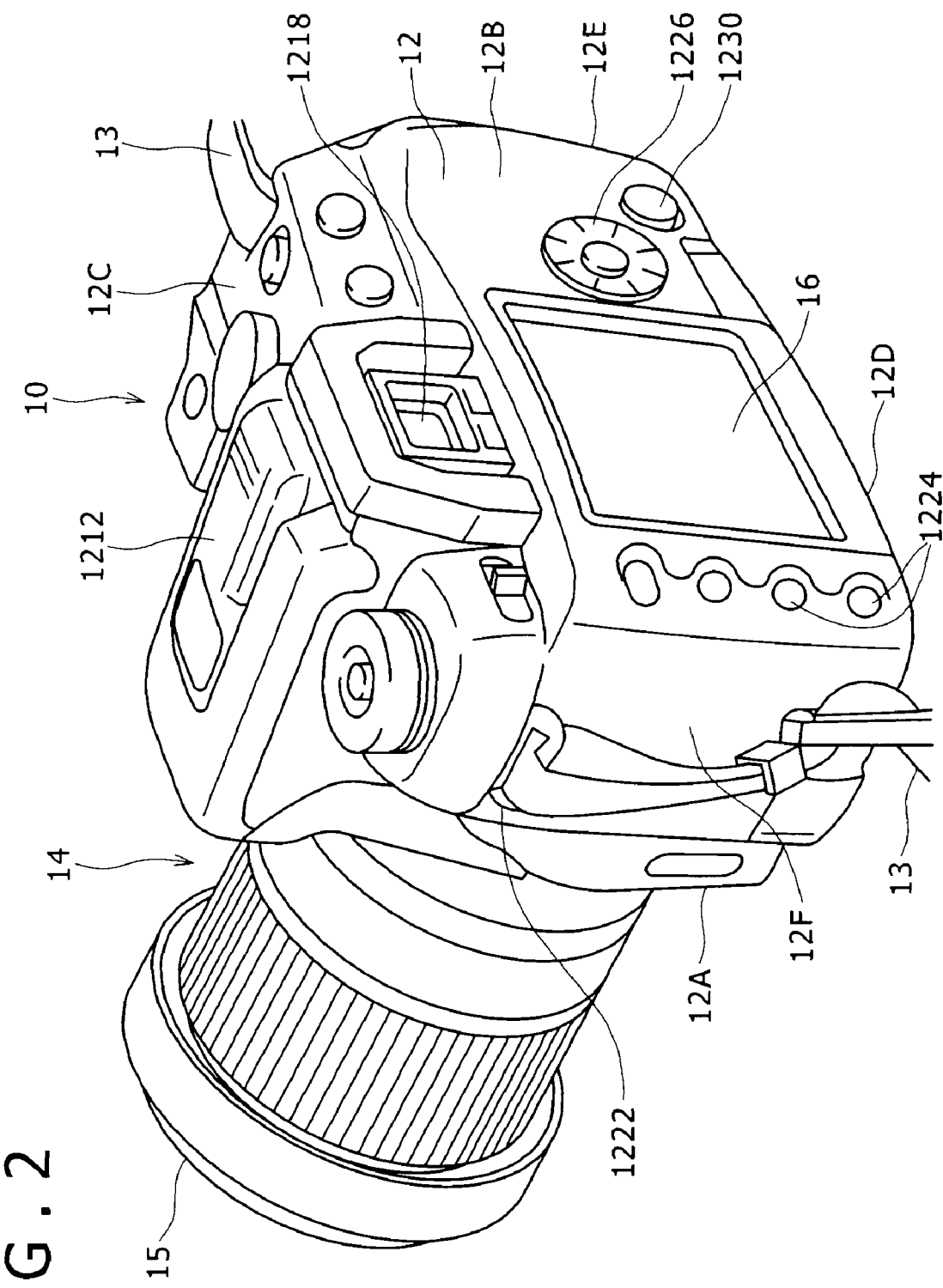
FIG. 2 is a perspective view of the imaging apparatus, as viewed from a rearward direction.

FIG. 1 is a perspective view of an imaging apparatus 10, to which an imaging device unit according to an embodiment of the present invention is applied, as viewed from a forward direction. FIG. 2 is a perspective view of the imaging apparatus 10, as viewed from a backward direction.

In this embodiment, the imaging apparatus 10 is a single-lens reflex-type digital still camera.

As shown in FIGS. 1 and 2, the imaging apparatus 10 is configured to have a housing 12, a lens barrel 14, etc.

The housing 12 forms an external armor and has a height in an upward/downward direction of a size more than a length of the housing in a forward/rearward direction, and a width in a left/right direction of a size more than the height in the upward/downward direction.

Incidentally, in this specification, the forward direction of the imaging apparatus 10 shall be referred to as the side of a subject, the rearward direction of the imaging apparatus 10 shall be referred to as the opposite side, and the left and right shall be referred to on the basis of the state where the imaging apparatus 10 is viewed from the forward direction.

The housing 12 has a front surface 12A facing in the forward direction, a rear surface 12B facing in the rearward direction, a top surface 12C facing in the upward direction, a bottom surface 12D facing in the downward direction, and side surfaces 12E, 12F facing in the left/right direction.

The lens barrel 14 is detachably mounted to a region of the front surface 12A except a left side portion of the front surface 12A.

Figure 7:
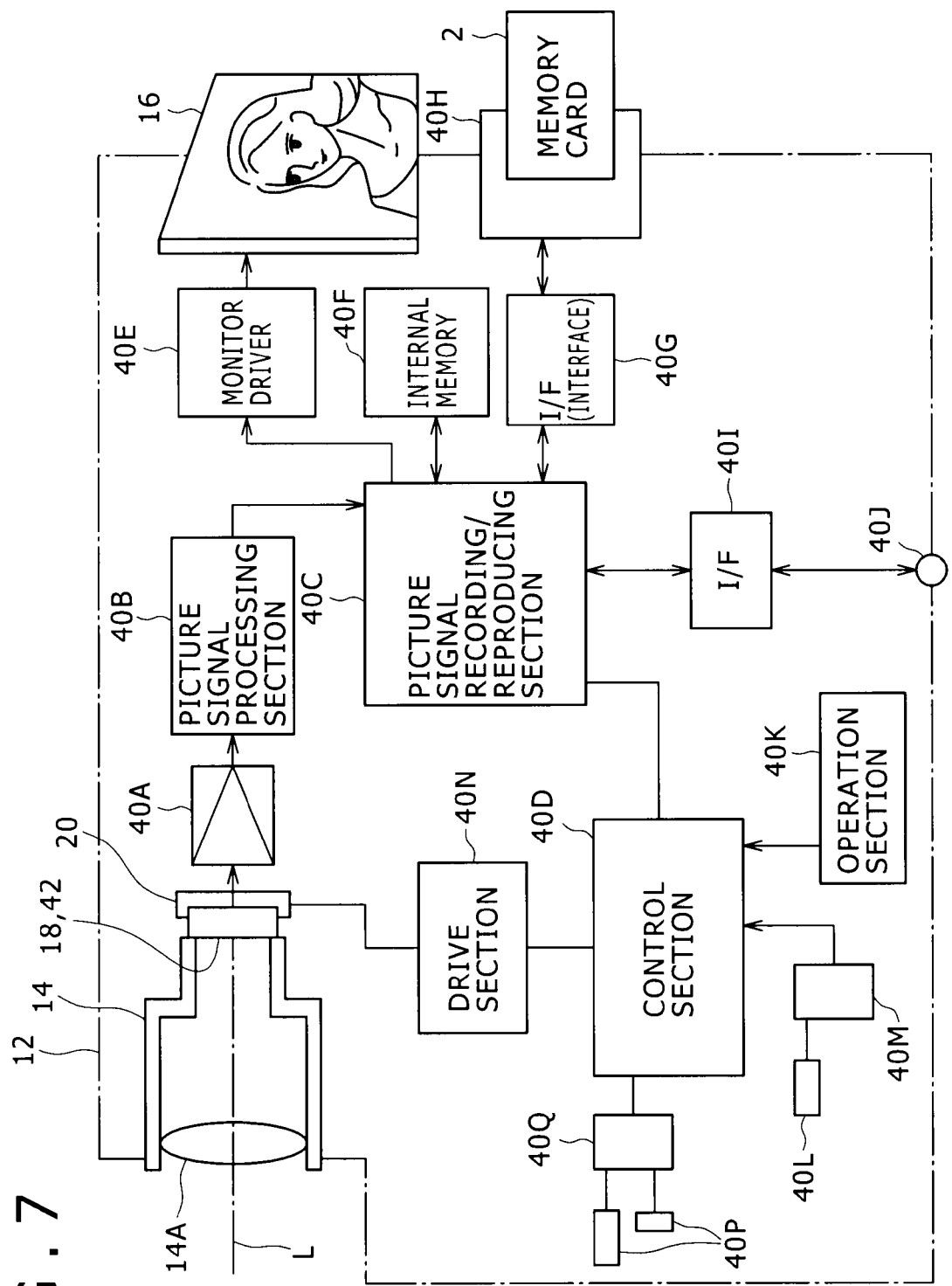
FIG. 7 is a block diagram illustrating a control system of the imaging apparatus.

In the interior of the housing 12, a hand shake compensation mechanism 20 that will be discussed hereinafter is incorporated. An imaging device unit 18 according to the embodiment of the present invention is supported to the hand shake compensation mechanism 20 and configured to include an imaging device 42 (FIG. 7).

An imaging optical system 14A for causing a subject image to be led to the imaging device unit 18 is incorporated in the lens barrel 14 which extends in the forward/rearward direction in the state of being mounted to the front surface 12A.

In FIG. 2, reference numeral 15 denotes a cap which is removably attached to a tip end of the lens barrel 14 in order to protect the imaging optical system 14A.

At the left side portion of the front surface 12A, a grip portion 1204 projects in the forward direction. The grip portion 1204 has the same height as that of the housing 12.

On a top surface of the grip portion 1204, a shutter button 1206 and an operating ring 1208 which are to be operated by a finger of the user's right hand gripping the grip portion 1204 are provided.

The operating ring 1208 is rotation-operated, to thereby serve to control a shutter speed and a set value of a diaphragm stop.

The left side surface 12E is provided with a recording medium housing portion (not shown) for allowing a recording medium, such as a memory card, recording an image data picked up by the imaging apparatus 10 to be inserted therein and drawn out therefrom.

The recording medium housing portion is openably and closably covered with an opening/closing lid 1210 that is swingably provided at the left side surface 12E.

On the top surface 12C, a flash portion 1212 for irradiating an imaging auxiliary light is provided so as to be capable of popping up and down.

At the left side and right side of the top surface 12C between which the flash portion 1212 is interposed, two operating dials 1214, 1216 for setting the functions of the imaging apparatus 10 and switching a shooting mode, etc. are respectively provided.

Of the two operating dials, one operating dial 1214 severs to set an image shooting mode.

The image shooting mode includes auto shooting in which various settings including setting of the shutter speed and the diaphragm stop are automatically performed, scene selection in which many types of shutter speed, diaphragm stop, etc. are previously prepared to a shooting situation, program auto shooting in which the setting of the shutter speed and the diaphragm stop is automatically performed and other settings are manually adjusted, diaphragm priority shooting in which the shutter speed is automatically set by manual setting of the diaphragm stop, shutter speed priority shooting in which the diaphragm stop is automatically set by manual setting of the shutter speed, manual mode shooting in which both the shutter speed and the diaphragm stop are manually set, etc.

Of the two operating dials, the other 1216 serves to set various functions associated with shooting.

The functions set by the operating dial 1216 include ISO sensitivity, white balance, a focus mode, flash, a light measuring mode, etc.

The setting of these functions is performed by operating both the operating dial 1216, and operating buttons 1224 and a cross key 1226, which will be discussed hereinafter, while visually recognizing a screen for setting which is displayed on a view finder 1218 or a display panel 16 which will be discussed hereinafter.

On an upper portion of the rear surface 12B, the view finder (optical type finder or electronic type finder) 1218 for allowing the subject image picked up by the imaging device 42 of the imaging device unit 18 to be visually recognized is provided.

At a substantially center portion of the rear surface 12B, a monitor, for example, the display panel 16 including a liquid crystal display device for displaying the subject image picked up by the imaging device 42, or a picture read out from the recording medium is provided.

Moreover, at a region of the top surface 12C that is adjacent the left side surface 12E, and a region of the top surface that is adjacent the right side surface 12F, left and right installation portions 1220, 1222 to which both ends of a hanging strap (shoulder strap) 13 are attached are provided.

At a region of the rear surface 12B around a periphery of the display panel 16, the plural operating buttons 1224, the cross key 1226, and a hand shake compensating switch 1230 which perform various operations are provided.

Incidentally, the shutter button 1206, the operating ring 1208, the operating dials 1214, 1216, the plural operating buttons 1224, the cross key 1226, the hand shake compensating switch 1230, etc. make up an operation section 40K (FIG. 7).

Figure 3:
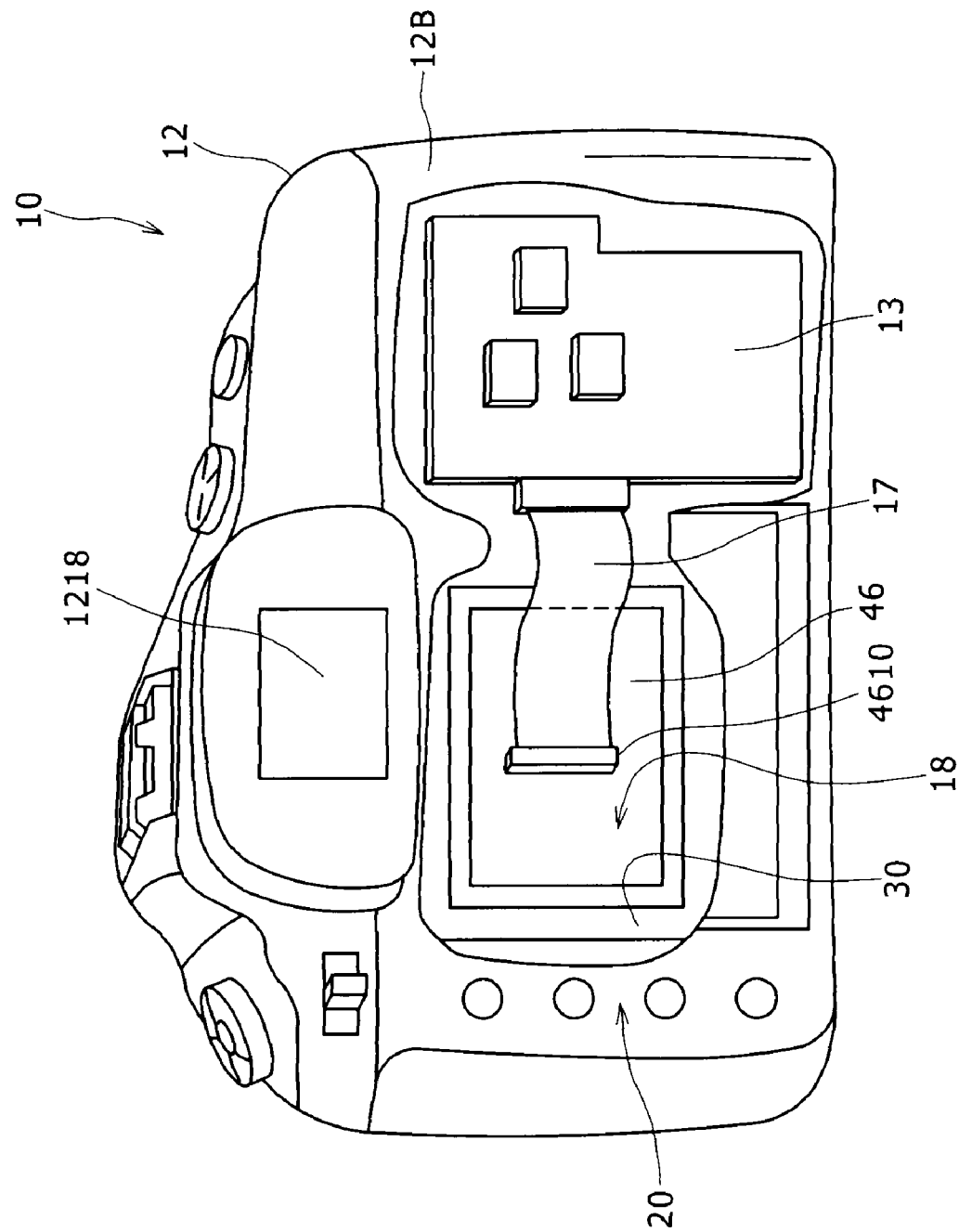
FIG. 3 is a perspective view illustrating an internal structure within a housing, in which a rear surface of the imaging apparatus is partially cut away.

FIG. 3 is a perspective view illustrating an internal structure within the housing 12, in which the rear surface 12B of the imaging apparatus 10 is partially cut away.

As shown in FIG. 3, a main substrate 13, the imaging device unit 18 and the hand shake compensation mechanism 20 are incorporated in the housing 12.

On the main substrate 13, an LSI for image processing and the like are carried.

The hand shake compensation mechanism 20 serves to support the imaging device unit 18 according to the embodiment of the present invention so as to allow it to be movable on a plane perpendicular to an optical axis of the imaging optical system 14A.

The imaging device unit 18 and the main substrate 13 are connected to each other by a flexible substrate 17.

(Hand Shake Compensation Mechanism 20)

Figure 4:
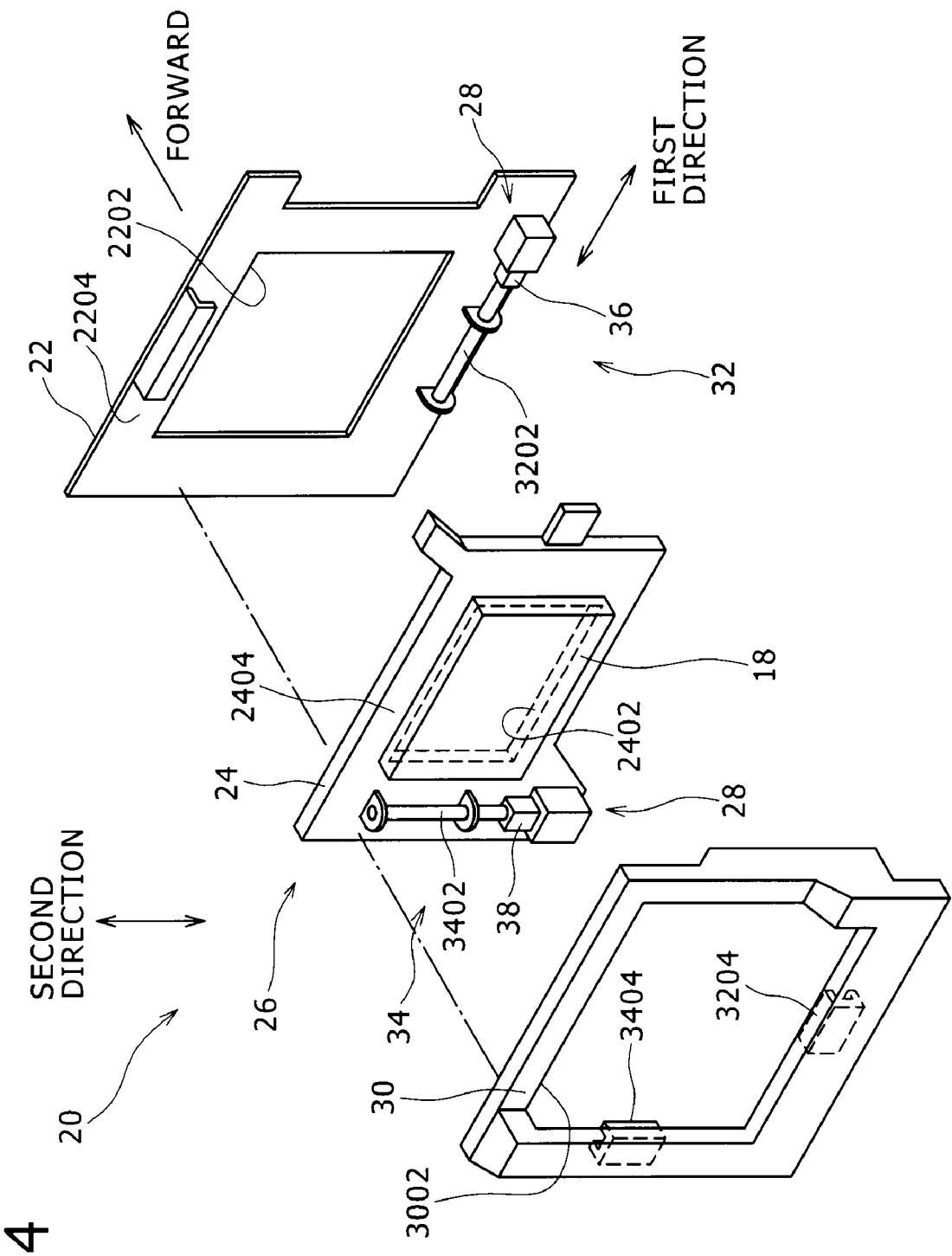
FIGS. 4 and 5 are exploded perspective views showing a structure of a hand shake compensation mechanism.
Figure 5:
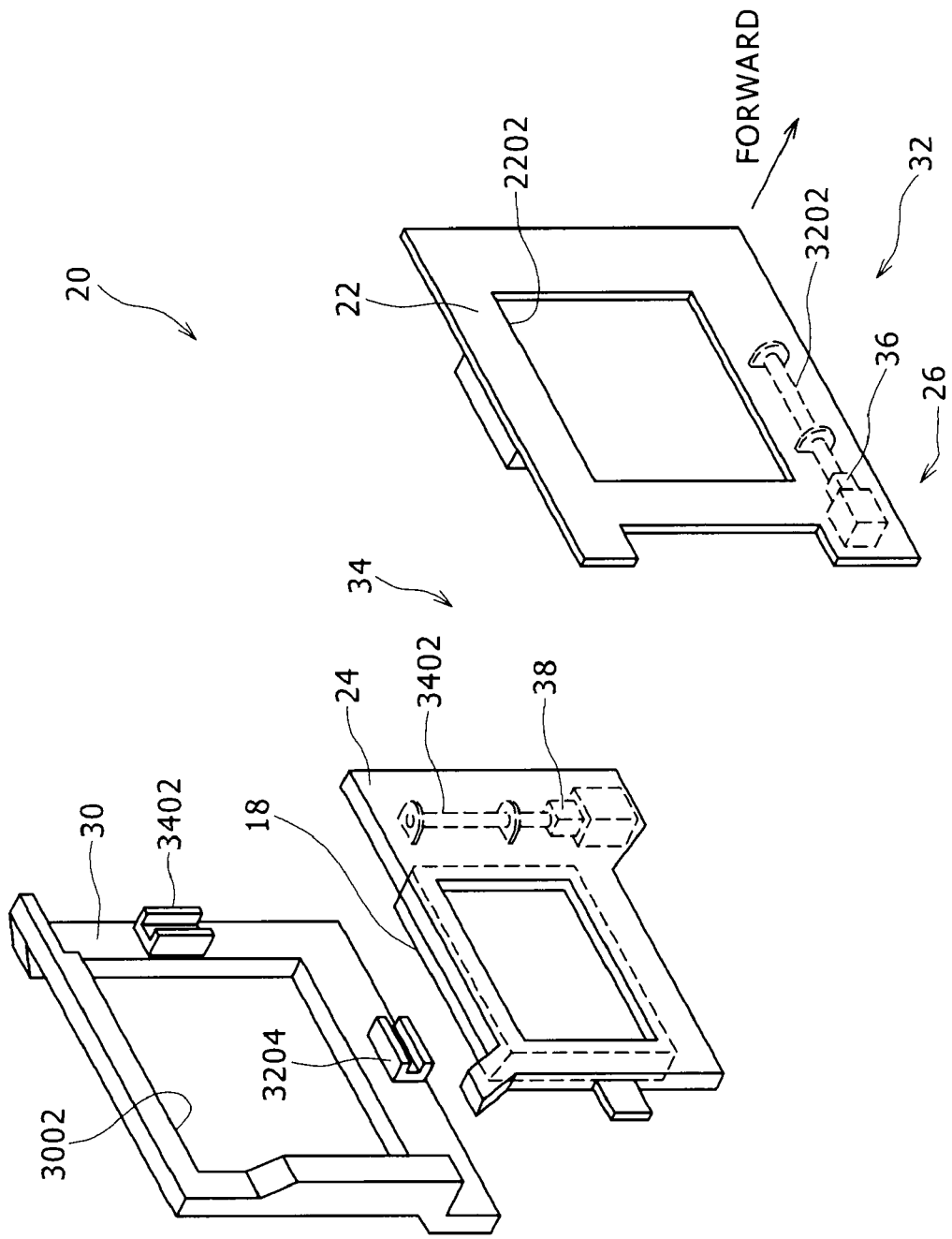
Figure 6:
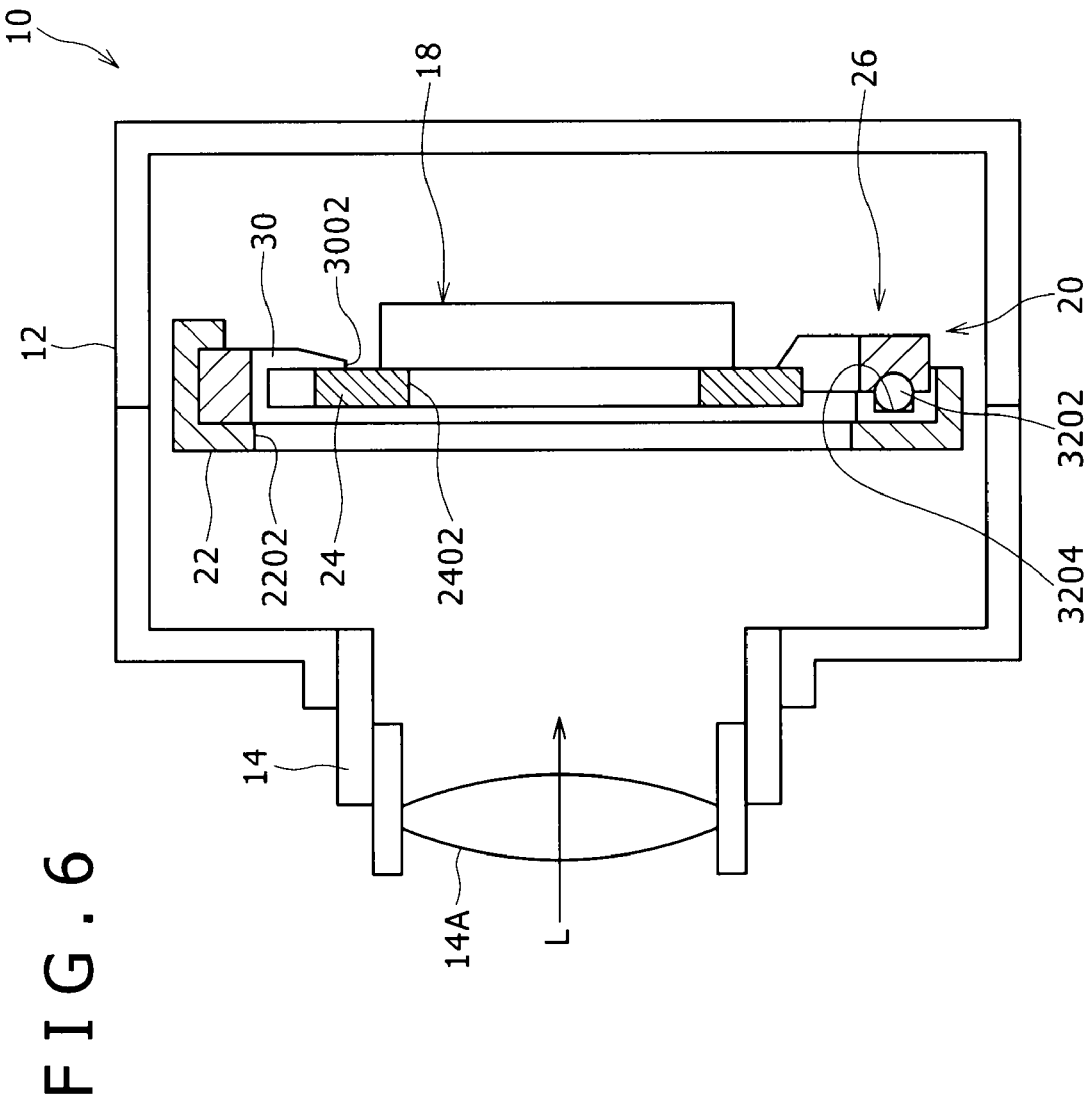
FIG. 6 is a sectional view of the imaging apparatus.

FIGS. 4 and 5 are exploded perspective views illustrating a structure of the hand shake compensation mechanism 20. FIG. 6 is a sectional view of the imaging apparatus 10.

As shown in FIGS. 4 to 6, the hand shake compensation mechanism 20 is configured to include a base 22, a movable element 24, a guide mechanism 26, a movement mechanism 28, etc.

The base 22 exhibits a rectangular frame plate shape having a rectangular opening 2202 formed at a center thereof, and is integrally mounted to the housing 12. A rear surface 2204 of the base 22 which faces in the rearward direction extends on the plane perpendicular to the optical axis L.

The movable element 24 exhibits a rectangular frame plate shape having a rectangular opening 2402 formed at a center thereof, and is arranged on the rear surface 2204 of the base 22 in parallel with the base 22.

The imaging device unit 18 is mounted to a rear surface 2404 of the movable element 24, which faces in the rearward direction, with an imaging surface thereof facing forward through the opening 2402.

The guide mechanism 26 serves to guide the movable element 24 on the base 22 so as to allow the movable element 24 to be movable on the plane perpendicular to the optical axis L. In other words, the guide mechanism 26 serves to guide the movable element 24 on the base 22 so as to allow the movable element 24 to be movable in first and second directions perpendicular to each other on the plane perpendicular to the optical axis L of the imaging optical system 14A.

In this embodiment, the guide mechanism 26 is configured to include a slider 30, a first guide mechanism 32 and a second guide mechanism 34.

Incidentally, in this embodiment, the first direction is the left/right direction and the second direction is the upward/downward direction.

The slider 30 exhibits a rectangular frame plate shape formed with an opening 3002 allowing the movement of the movable element 24, and is provided rearward of the movable element 24 in such a manner that the movable element 24 is interposed between the base 22 and the slider 30.

The first guide mechanism 32 has a first guide shaft 3202 and a first bearing portion 3204.

The first guide shaft 3202 is provided at a portion of the rear surface 2204 of the base 22 so as to extend along the first direction.

The first bearing portion 3204 is provided on a front surface of the slider 30, which faces the base 22, and slidably coupled to the first guide shaft 3202.

The second guide mechanism 34 has a second guide shaft 3402 and a second bearing portion 3404.

The second guide shaft 3402 is provided at a portion of the rear surface 2404 of the movable element 24 so as to extend along the second direction.

The second bearing portion 3404 is provided on the front surface of the slider 30, which faces the movable element 24, and slidably coupled to the second guide shaft 3402.

Therefore, the slider 30 is adapted to be guided by the first guide mechanism 32 so as to be movable in the first direction on the base 22, and the movable element 24 is adapted to be guided by the second guide mechanism 34 so as to be movable in the second direction on the slider 30.

Namely, the imaging device unit 18 mounted to the movable element 24 is adapted to be guided by the guide mechanism 26 so as to be movable in the first and second directions on the base 22. Incidentally, the movable element 24 is supported by various structures known in the past so as to be unmovable in the direction of the optical axis L, when the movable element 24 is guided by the guide mechanism 26.

In this embodiment, the movement mechanism 28 is configured to include a first piezoelectric element 36 and a second piezoelectric element 38.

The first piezoelectric element 36 is connected to an end portion of the first guide shaft 3202 and severs to cause the slider 30, i.e., the movable element 24 to be moved in the first direction through the first bearing portion 3204 by undergoing expansion/contraction movement to thereby cause the first guide shaft 3202 to be axially displaced.

The second piezoelectric element 38 is connected to an end portion of the second guide shaft 3402 and serves to cause the movable element 24 to be moved in the second direction through the second bearing portion 3404 by undergoing expansion/contraction movement to thereby cause the second guide shaft 3402 to be axially displaced.

The expansion/contraction movements of the first and second piezoelectric elements 36, 38 are performed by supply of drive signals (sawtoothed voltage) to the first and second piezoelectric elements 36, 38 from a drive section 40N (FIG. 7).

Therefore, the first piezoelectric element 36, the first guide shaft 3202 and the first bearing portion 3204 make up a first piezoelectric actuator causing the imaging device unit 18 (movable element 24) to be moved in the first direction. The second piezoelectric element 38, the second guide shaft 3402 and the second bearing portion 3404 make up a second piezoelectric actuator causing the movable element 24 to be moved in the second direction.

While the case where the movement mechanism 28 is constituted by the first and second piezoelectric actuators has been discussed with respect to this embodiment, various movement mechanisms known in the past, such as electromagnetic actuators using magnetic interaction between coils and magnets, may be employed as the movement mechanism 28.

(Control System)

FIG. 7 is a block diagram illustrating a control system of the imaging apparatus 10.

In addition to the housing 12, the lens barrel 14, the display panel 16, the imaging device unit 18, the hand shake compensation mechanism 20, etc., the imaging apparatus 10 is provided with a picture signal amplification section 40A, a picture signal processing section 40B, a picture signal recording/reproducing section 40C, a control section 40D, a monitor driver 40E, an internal memory 40F, an interface 40G for a memory card, a slot 40H for the memory card, an external input/output interface 40I, an external input/output terminal 40J, the operation section 40K, a hand shake detecting section 40L, a hand shake signal processing section 40M, the drive section 40N, a position detecting section 40P, a position detection signal processing section 40Q, etc.

A picked-up image signal which is generated in the imaging device unit 18 is amplified in the picture signal amplification section 40A, subjected to predetermined signal processing by the picture signal processing section 40B, and supplied to the picture signal recording/reproducing section 40C as a picture signal.

According to control by the control section 40D, the picture signal recording/reproducing section 40C causes the picture signal, supplied from the picture signal processing section 40B, to be recorded in the memory card 2 that serves as the recording medium and is mounted in the slot 40H for the memory card through the interface 40G for the memory card.

Also, the picture signal recording/reproducing section 40C supplies, through the monitor driver 40E, to the display panel 16 the picture signal supplied from the picture signal processing section 40B, or the picture signal supplied through the interface 40G for the memory card from the memory card 2, and causes the display panel 16 to perform displaying of a picture.

The control section 40D performs control of the picture signal recording/reproducing section 40C on the basis of the operation of the operation section 40K.

The internal memory 40F provides a memory area necessary for operation of the picture signal recording/reproducing section 40C.

The external input/output interface 40I serves to receive and supply the picture signal between external electronic equipment, connected to the external input/output terminal 40J, and the picture signal recording/reproducing section 40C.

The hand shake detecting section 40L serves to detect acceleration applied to the imaging apparatus 10, or the direction and magnitude of hand shake occurring due to vibration, etc., and outputs a hand shake detection signal corresponding to the direction and magnitude of the hand shake.

As the hand shake detecting section 40L, there may be employed various sensors known in the past, for example, gyro sensors.

The hand shake signal processing section 40M generates a hand shake compensation signal, serving as a digital signal and representative of the direction and magnitude of the hand shake, from a hand shake detection signal supplied as an analogue signal from the hand shake detecting section 40L, and supplies the hand shake compensation signal to the control section 40D.

The position detecting section 40P serves to detect a position of the movable element 24 (FIGS. 4 to 6), holding the imaging device 42, in the first and second directions perpendicular to each other on the plane perpendicular to the optical axis L of the imaging optical system 14A, and outputs a position detection signal corresponding to the position of the movable element 24.

As the position detecting section 40P, there may be employed various sensors known in the past, which include, for example, magnets, in which the N poles and the S poles are repeatedly magnetized in longitudinal directions of the magnets, and magnetic resistance elements (MR elements) arranged oppositely to the magnets, and use detection signals that are obtained from the magnetic resistance elements according to change in relative positions between the magnets and the magnetic resistance elements.

The position detection signal processing section 40Q generates a position detection signal as a digital signal representative of a position from a position detection signal supplied from the position detecting section 40P as an analogue signal, and supplies the position detection signal to the control section 40D.

The control section 40D produces an actuator control signal on the basis of the hand shake compensation signal supplied from the hand shake signal processing section 40M, and supplies the actuator control signal to the drive section 40N.

The drive section 40N supplies a drive signal, which it produces on the basis of the supplied actuator control signal, to the first and second piezoelectric elements 36, 38, to thereby drive the first and second piezoelectric elements 36, 38.

The control section 40D controls the hand shake detecting section 40L, the hand shake signal processing section 40M, the position detecting section 40P, the position detection signal processing section 40Q, the drive section 40N, and the first and second piezoelectric elements 36, 38 in this way, whereby hand shake compensating operation is performed.

Moreover, the control section 40D performs feedback control on the basis of the position detection signal supplied from the position detection signal processing section 40Q, at the time of producing the hand shake compensation signal, whereby high accuracy in the control of the position of the movable element 24 is realized.

Moreover, on the basis of turning on/off of the hand shake compensating switch 1230 (FIG. 2), the control section 40D controls the respective sections, whereby the hand shake compensating operation is performed or stopped.

(Imaging Device Unit 18)

Next, the imaging device unit 18 to which the gist of the present invention is applied will be discussed.

Figure 8:
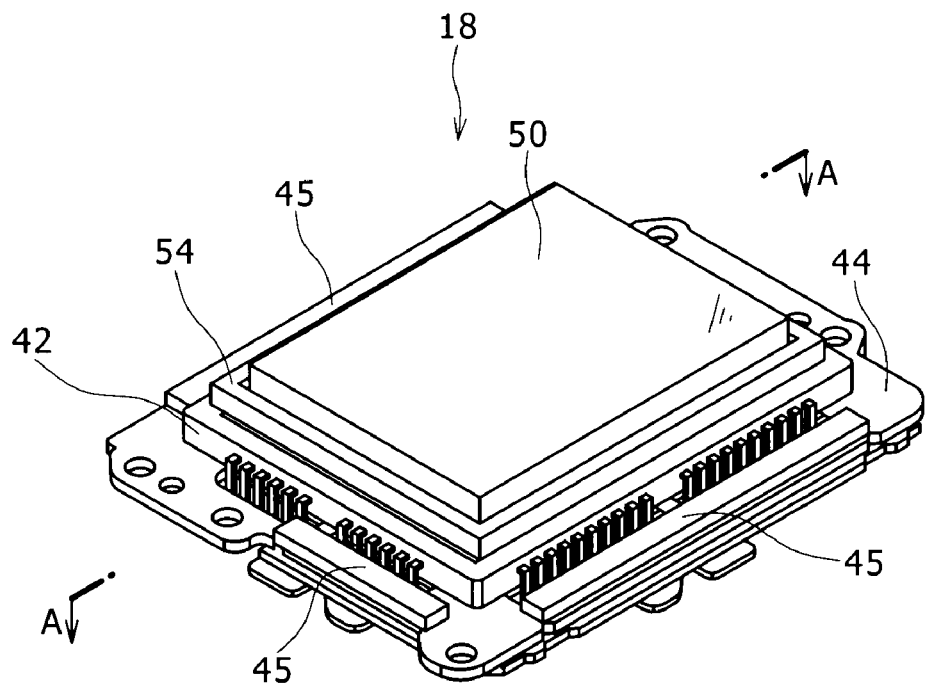
FIG. 8 is a perspective view of an imaging device unit.
Figure 9:
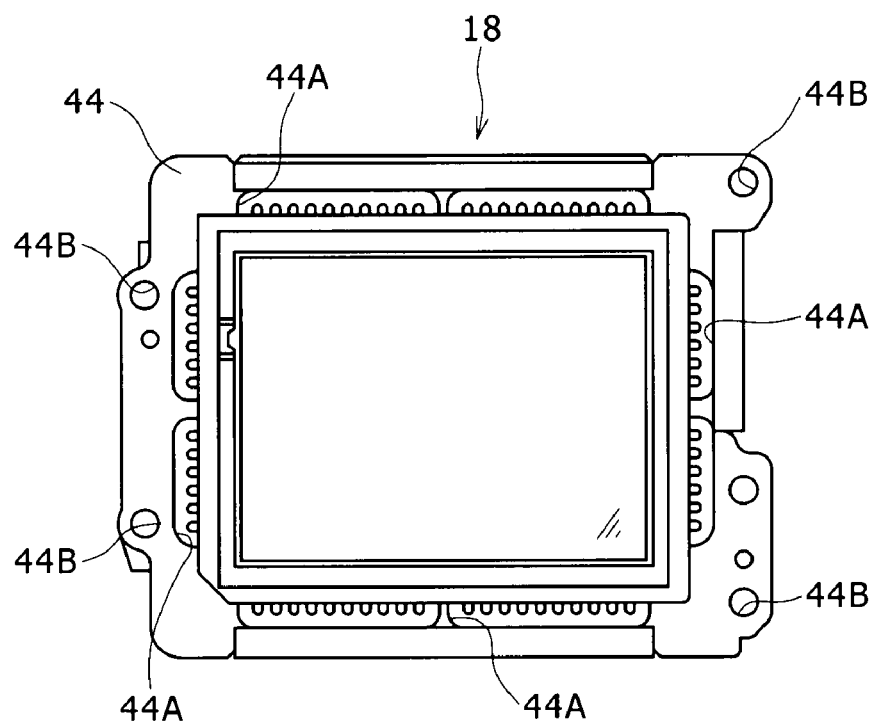
FIG. 9 is a plan view of the imaging device unit.
Figure 10:
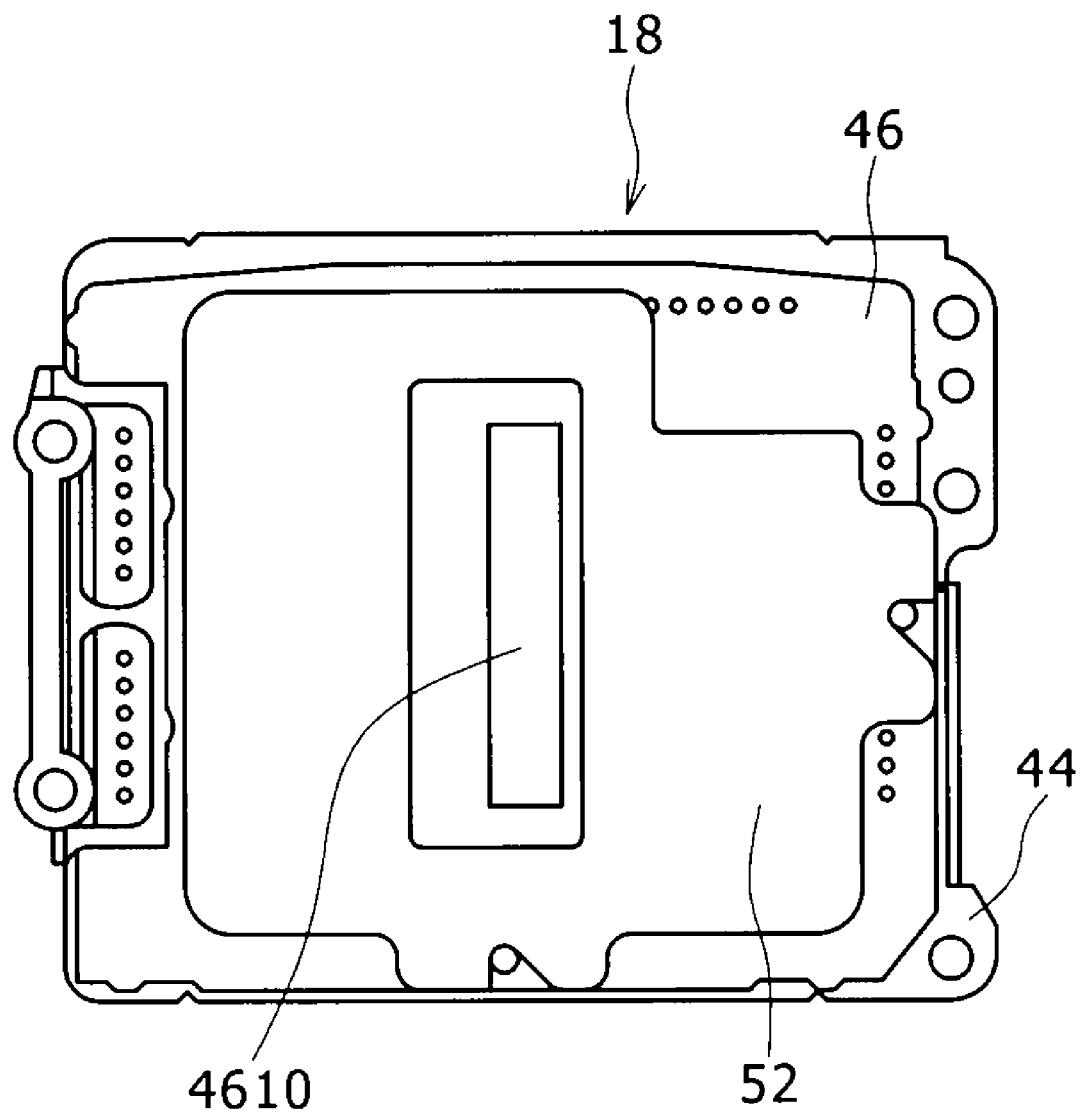
FIG. 10 is a rear view of the imaging device unit.

FIG. 8 is a perspective view of the imaging device unit 18, FIG. 9 is a plan view of the imaging device unit 18, and FIG. 10 is a rear view of the imaging device unit 18.

Figure 11:
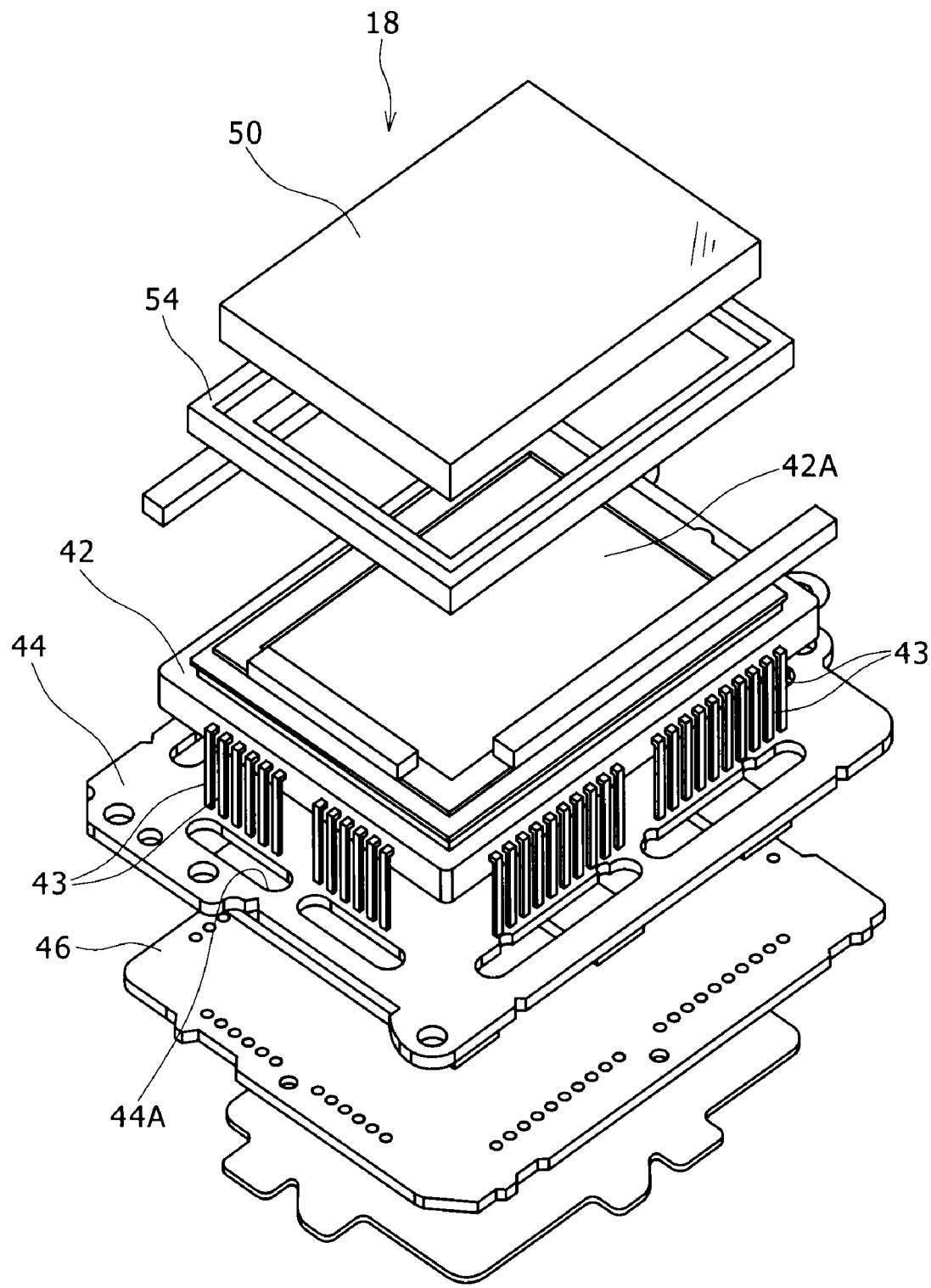
FIGS. 11 to 13 are exploded perspective views of the imaging device unit.
Figure 12:
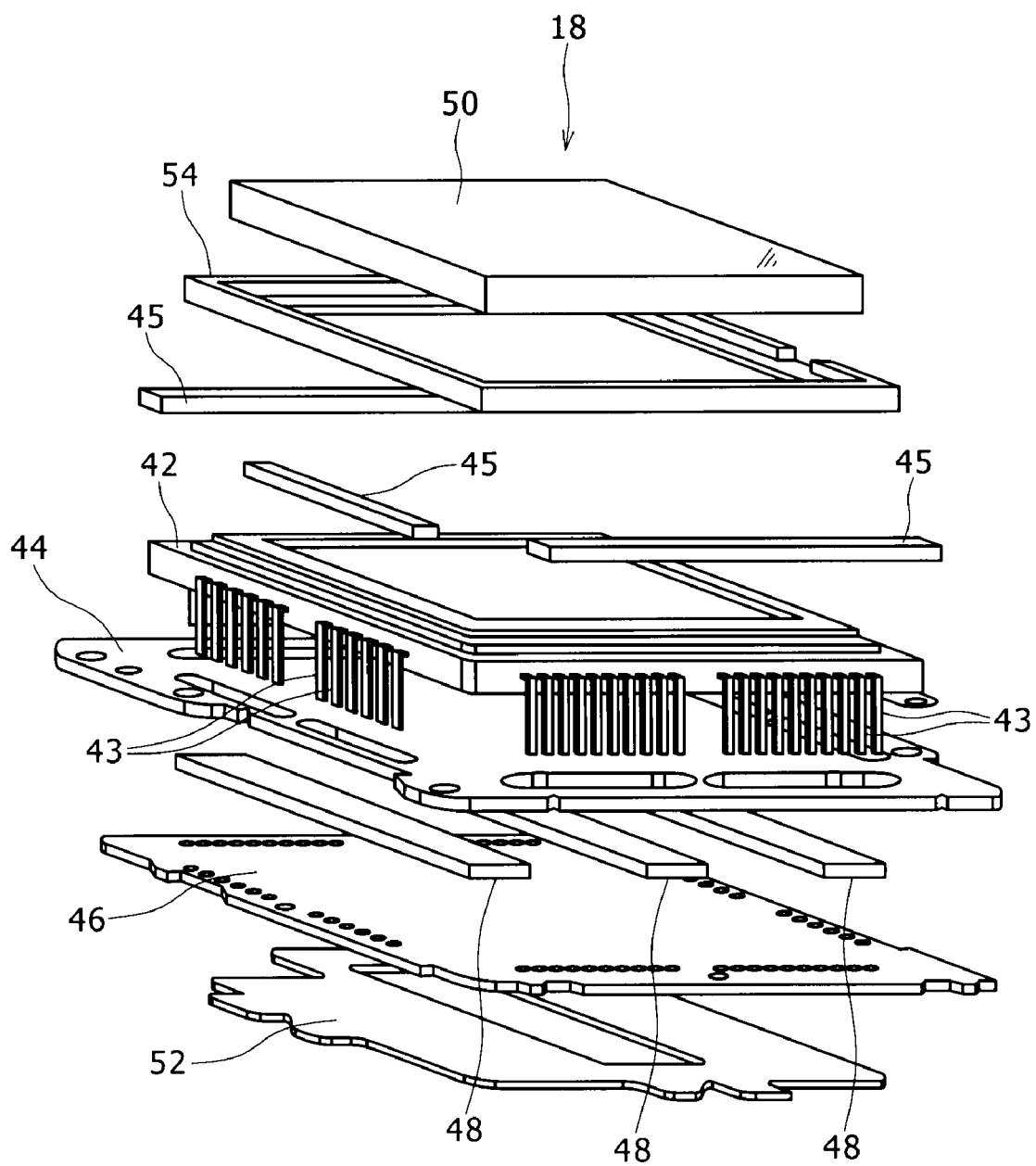
Figure 13:
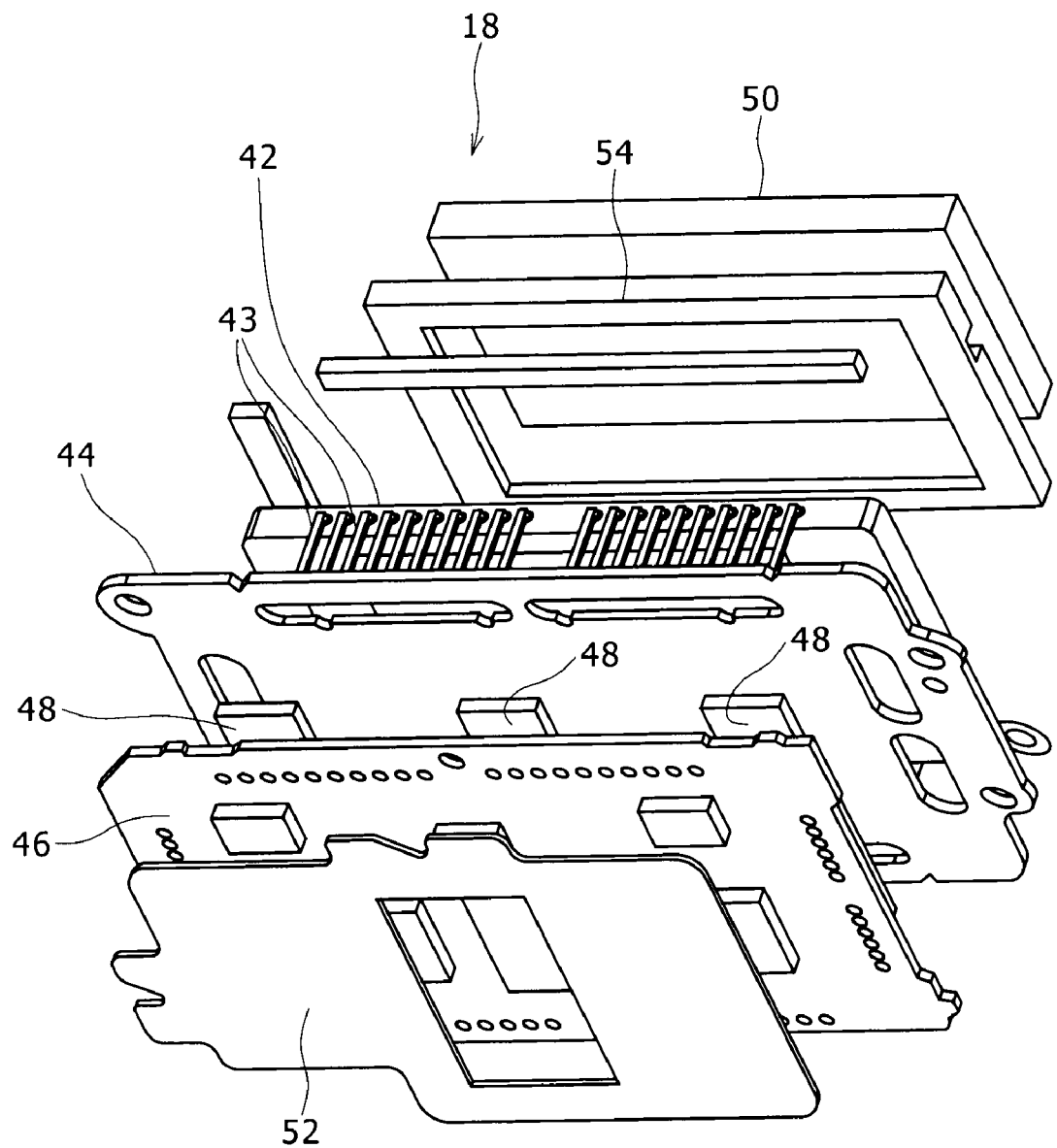

FIGS. 11 to 13 are exploded perspective views of the imaging device unit 18.

Figure 14:
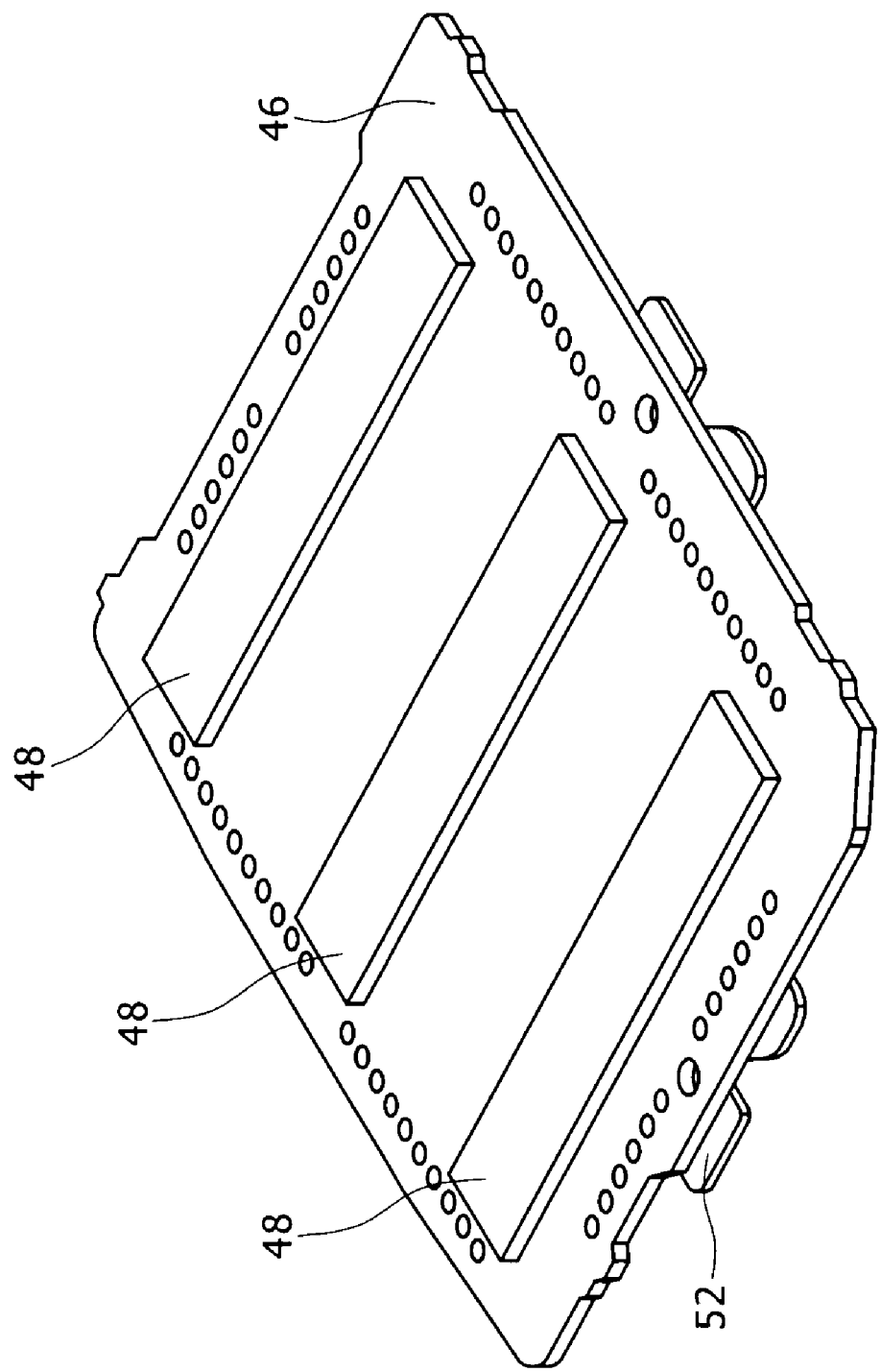
FIG. 14 is a perspective view of a signal processing substrate and spacers.

FIG. 14 is a perspective view of a signal processing substrate and spacers.

FIG. 15 is a sectional view taken along line A-A of FIG. 8.

The imaging device unit 18 is configured to include the imaging device 42, a heat radiating plate 44, a signal processing substrate 46, spacers 48, and a cover glass 50.

The imaging device 42 exhibits a rectangular plate shape, one of whose surfaces in a width direction thereof is an imaging surface 42A and the other of whose surfaces is a rear surface 42B.

The imaging device 42 serves to pick up a subject image, which is led to the imaging surface 42A by the imaging optical system 14A, and produces a picked-up image signal.

In this embodiment, the imaging device 42 is constituted by a CCD (Charge Coupled Device).

A plurality of leads 43 for connection to the signal processing substrate 46 are projected from side surfaces of the imaging device 42.

The imaging device 42 is operated on the basis of electrical power and a drive signal, which are supplied from the signal processing substrate 46, and supplies the produced picked-up image signal to the signal processing substrate 46.

The heat radiating plate 44 serves to radiate heat produced in the imaging device 42, and is formed of material superior in thermal conductivity, for example, aluminum or the like.

Incidentally, in this embodiment, the imaging device unit 18 is moved by the hand shake compensation mechanism 20, so that it is necessary to realize a reduction in the weight of the imaging device unit 18. For this purpose, the material of which the heat radiating plate 44 is formed is preferably aluminum or the like that is lightweight.

The heat radiating plate 44 is mounted onto the rear surface 42B of the imaging device 42 by adhesive.

The heat radiating plate 44 exhibits a rectangular shape having a contour larger than the imaging device 42.

The heat radiating plate 44 is mounted onto the rear surface 42B of the imaging device 42 with four sides of the heat radiating plate 44 being parallel to four sides of the imaging device 42, in such a manner that the imaging device 42 is allowed to be arranged at a center of the contour of the heat radiating plate 44 when viewed from a width direction of the heat radiating plate 44.

In regions of the heat radiating plate 44, which positionally correspond to the four sides of the imaging device 42, namely, regions of the heat radiating plate 44 which are adjacent edges of the heat radiating plate 44, elongated holes 44A are formed so as to extend along the edges.

As shown in FIG. 9, a plurality of screw insertion holes 44B are provided at outer peripheral portions of the heat radiating plate 44. Screws which are inserted through the screw insertion holes 44B are threadedly fitted in the movable element 24 (FIG. 6) of the hand shake compensation mechanism 20, whereby the outer peripheral portions of the heat radiating plate 44 and the hand shake compensation mechanism 20 are coupled to one another. Therefore, the heat radiating plate 44 is moved by the hand shake compensation mechanism, to thereby cause the imaging device unit 18 to be moved in the two directions perpendicular to each other in a plane parallel to the imaging surface 42A.

Incidentally, in this embodiment, when the connection between the outer peripheral portions of the heat radiating plate 44 and the movable element 24 is to be made, as shown in FIGS. 8 and 12, three heat radiating sheets 45 which are formed of silicone rubber superior in thermal conductivity are interposed between the outer peripheral portions of the heat radiating plate 44 and the movable element 24, to thereby realize an improvement in thermal conductivity of heat conducted from the heat radiating plate 44 to the movable element 24.

The signal processing substrate 46 serves to supply the electrical power and the drive signal to the imaging device 42 through the leads 43, to thereby drive the imaging device 42, and also serves to cause the picked-up image signal supplied through the leads 43 from the imaging device 42 to be subjected to necessary signal processing and, thereafter, supplies the picked-up image signal to the picture signal amplification section 40A (FIG. 7) through the flexible substrate 17 (FIG. 3). Incidentally, as shown in FIG. 3 and FIG. 10, the signal processing substrate 46 and the flexible substrate 17 are electrically connected to each other through a connector 4610.

The signal processing substrate 46 exhibits a rectangular plate shape having the substantially same size as that of the heat radiating plate 44.

As shown in FIG. 15, electronic components 4402, such as an LSI, an IC, a resistance, a condenser, etc., which form a circuit for supplying the electrical power and the drive signal to the imaging device 42 and causing the picked-up image signal supplied from the imaging device 42 to be subjected to the signal processing, are mounted on a surface of the signal processing substrate 46 which is opposite to a surface of the signal processing substrate 46 which is opposed to the heat radiating plate 44, and are not mounted on the surface of the signal processing substrate 46 which is opposed to the heat radiating plate 44.

As shown in FIGS. 14 and 15, the heat radiating plate 44 and the signal processing substrate 46 are opposedly arranged in parallel with each other with the spacers 48 being interposed therebetween and with space portions S being obtained therebetween.

As shown in FIG. 12, the spacer 48 exhibits a long and thin shape and, more particularly, the spacer 48 is formed in a flat, rectangular plate shape having a width wider than a thickness thereof and a length longer than the width.

The spacer 48 is formed of material, whose thermal conductivity is low, such as synthetic resin, etc.

The plural spacers 48 are provided in parallel. The plural spacers 48 are arranged so as to be spaced apart from each other.

Therefore, the space portion S is divided by the spacers 48, whereby the spacer portion S is plurally provided.

Moreover, the respective spacers 48 linearly extend, so that the respective space portions S are open at edge portions of the heat radiating plate 44 and signal processing substrate 46.

As shown in FIG. 15, through-holes 46A that serve as connection portions to which the leads 43 are electrically connected are formed in four sides of the signal processing substrate 46. Incidentally, as long as the connection portions allow the connection of the leads, they are not limited to the through-holes. As the connection portions, there may be employed various connection structures known in the past, such as pads, etc.

The leads 43 projecting from the imaging device 42 are inserted through the elongated holes 44A of the heat radiating plate 44, inserted, at end portions thereof, through the through-holes 46A of the signal processing substrate 46, and joined to the signal processing substrate 46 by soldering.

A heat radiating sheet 52 is adhesive-bonded onto surfaces of the electronic components 4402 which are located oppositely to the signal processing substrate 46.

The heat radiating sheet 52 serves to radiate heat that is produced in the electronic components 4402 mounted on the signal processing substrate 46. The imaging device unit 18 is moved by the hand shake compensation mechanism 20, so that it is necessary to realize a reduction in the weight of the image device unit 18. For this purpose, as material of which the heat radiating sheet 52 is formed, material whose coefficient of thermal conductivity is high and which is lightweight is preferable.

In this embodiment, as the heat radiating sheet 52, a graphite sheet that has a coefficient of thermal conductivity (800 W/m·K) higher than that of metal material is employed.

As shown in FIGS. 8, 11 and 15, the cover glass 50 is adhesive-bonded to a periphery of the imaging surface 42A through a holder 54 and airtightly covers the imaging substrate 42A.

The cover glass 50 may have a function of an optical filter or may have one or more optical filters superposed thereon.

According to this embodiment, the heat radiating plate 44 provided at the rear surface 42B of the imaging device 42, and the signal processing substrate 46 are opposedly arranged with the spacers 48 being interposed therebetween and with the space portions S being obtained therebetween.

Therefore, the layers of air that are present in the space portions S exhibit thermal insulation effects between the heat radiating plate 44 and the signal processing substrate 46, thus resulting in becoming advantageous in preventing the heat of the signal processing substrate 46 from being transferred directly to the imaging device 42 through the heat radiating plate 44.

Moreover, as compared to the related art structure in which the heat radiating plate and the signal processing substrate are closely adhered to each other, areas of the heat radiating plate 44 and signal processing substrates 46 which contact air can be more widely obtained, thus resulting in becoming advantageous in improving heat radiation efficiency of the imaging device 42 and the signal processing substrate 44.

In addition, convection of air in the space portions S formed between the heat radiating plate 44 and the signal processing substrate 46 occurs due to the heat, thus resulting in becoming advantageous in enhancing the heat radiation efficiency.

For the above reasons, it is possible to effectively prevent an increase in the temperature of the imaging device 42, thus resulting in becoming advantageous in realizing stable operation of the imaging device 42, realizing a reduction in the noise components generated in the picked-up image signal, and improving a quality of the picked-up image signal.

Particularly, in the case where continuous shooting capability is called for and continuous image-picking-up operation is repeated for a short time, as in the case where the imaging apparatus 10 is the single-lens reflex type imaging device, high heat is produced from the imaging device 42 and the signal processing substrate 46, so that when the service temperature of the imaging device 42 is exceeded, it is necessary to forcedly stop the operation of the imaging device 42.

However, this embodiment can suppress an increase in the temperature of the imaging device 42, so that the frequencies of the compulsory stopping of the operation of the imaging device 42 can be reduced, thus resulting in becoming advantageous in realizing an improvement in the continuous shooting capability.

Moreover, in this embodiment, the respective space portions S are open at the edge portions of the heat radiating plate 44 and signal processing substrate 46, so that the air in the space portions S which is warmed by the heat radiated from the heat radiating plate 44 and/or the signal processing substrate 46 is moved through the open regions of the space portions S by convection, thus resulting in becoming further advantageous in enhancing the thermal radiation effects.

Moreover, in the case of the structure in which, as in this embodiment, the imaging apparatus 10 is provided with the hand shake compensation mechanism 20 and the imaging device unit 18 is connected to the movable element 24 of the hand shake compensation mechanism 20, the movable element 24 is adapted to be moved, so that the volume and surface area of the movable element 24 are small. Therefore, heat is hard to be radiated from the movable element 24 and such a structure is disadvantages in suppressing the increase in the temperature of the imaging device 42.

Moreover, in the case where the imaging device unit 18 is moved by the hand shake compensation mechanism 20, it is necessary to reduce the weight of the imaging device unit 18 in order to realize an improvement in a response speed of a hand shake compensation function and saving of consumed electrical power, so that there is a limitation in realizing the improvement in the heat radiation capability by providing heavy heat-radiating components to the imaging device unit 18.

However, in this embodiment, the space portions S are obtained between the heat radiating plate 44 provided at the rear surface 42B of the imaging device 42, and the signal processing substrate 46, thus resulting in becoming advantageous in effectively suppressing the increase in the temperature of the imaging device 42.

Moreover, in this embodiment, the imaging device unit 18 is moved along the plane perpendicular to the optical axis L of the imaging optical system 14A by means of the hand shake compensation mechanism 20, so that according to the movement of the imaging device unit 18, the air in the space portions S is also forcedly moved through the open regions of the space portions S, thus resulting in becoming advantageous in further enhancing the heat radiation effects.

Moreover, in this embodiment, in assembling of the imaging device unit 18, provisional assembling of the imaging device 42 and the heat radiating plate 44 can be carried out by bonding the heat radiating plate 44 onto the rear surface 42B of the imaging device 42 in a condition where the leads 43 of the imaging device 42 are inserted through the elongated holes 44A of the heat radiating plate 44, without utilizing a special jig. In this provisionally assembled state, insertion of the leads 43 into the through-holes 46A of the signal processing substrate 46 is carried out and soldering operation of the leads can be easily performed, thus resulting in becoming advantageous in improving an efficiency in the assembling operation of the imaging device unit 18.

Incidentally, while the case where the CCD is employed as the imaging device has been discussed with reference to this embodiment, various imaging devices known in the past, such as C-MOS sensors, etc. are applicable.

Moreover, while this embodiment has been discussed by employing the digital still camera as the imaging apparatus, the present invention is applicable to video cameras and other various imaging apparatuses.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device unit comprising:
an imaging device having an imaging surface located on one side thereof in a width direction thereof and a rear surface located oppositely to the imaging surface;
a heat radiating plate radiating heat generated in the imaging device, the heat radiating plate being arranged at the rear surface of the imaging device; and
a signal processing substrate causing the imaging device to be operated, wherein
the heat radiating plate and the signal processing substrate are arranged opposedly to each other with a spacer being interposed therebetween and with a space portion being obtained therebetween,
the heat radiating plate has a contour larger than the imaging device,
the imaging device is arranged so as to be located in the contour of the heat radiating plate, as viewed from a width direction of the heat radiating plate,
the imaging device has a plurality of leads transmitting electrical power and a drive signal, which are supplied to the imaging device, and a picked-up imaging signal generated in the imaging device, the plurality of leads projecting from a periphery of the imaging device, and
the heat radiating plate has elongated holes formed in regions thereof which are adjacent edge portions of the heat radiating plate, the elongated holes being formed so as to extend along the edge portions of the heat radiating plate, and the signal processing substrate has connections portions, the leads being inserted through the elongated holes and connected at end portions thereof to the connection portions by soldering.

2. The imaging device unit according to claim 1, wherein the space portion is open at edge portions of the heat radiating plate and the signal processing substrate.

3. The imaging device unit according to claim 1, wherein:
the spacer includes a plurality of spacers so as to be spaced apart from each other;
the space portion is divided by the plural spacers whereby the space portion includes a plurality of space portions; and
the respective space portions divided by the spacers are open at edge portions of the heat radiating plate and the signal processing substrate.

4. The imaging device unit according to claim 1, wherein:
the signal processing substrate has a plurality of electronic components mounted thereon, which make up a circuit which supplies electrical power and a drive signal to the imaging device and causes a picked-up image signal supplied from the imaging device to be subjected to signal processing; and
the electronic components are mounted on a surface of the signal processing substrate which is opposite to a surface of the signal processing substrate which is opposed to the heat radiating plate, and the electronic components being not mounted on the surface of the signal processing substrate which is opposed to the heat radiating plate.

5. The imaging device unit according to claim 4, further comprising:
a heat radiating sheet radiating heat generated in the electronic components, the heat radiating sheet being attached onto surfaces of the electronic components which are located oppositely to the signal processing substrate.

6. An imaging apparatus comprising:
a housing; and
an imaging device unit disposed within the housing, wherein the imaging device unit includes,
an imaging device having an imaging surface located on one side thereof in a width direction thereof, and a rear surface located oppositely to the imaging surface,
a heat radiating plate radiating heat generated in the imaging device, the heat radiating plate being arranged at the rear surface of the imaging device, and
a signal processing substrate causing the imaging device to be operated,
the heat radiating plate and the signal processing substrate are arranged oppositely to each other with a spacer being interposed therebetween and with a space portion being obtained therebetween,
the heat radiating plate has a contour larger than the imaging device,
the imaging device is arranged so as to be located in the contour of the heat radiating plate, as viewed from a width direction of the heat radiating plate,
the imaging device has a plurality of leads transmitting electrical power and a drive signal, which are supplied to the imaging device, and a picked-up imaging signal generated in the imaging device, the plurality of leads projecting from a periphery of the imaging device, and
the heat radiating plate has elongated holes formed in regions thereof which are adjacent edge portions of the heat radiating plate, the elongated holes being formed so as to extend along the edge portions of the heat radiating plate, and the signal processing substrate has connections portions, the leads being inserted through the elongated holes and connected at end portions thereof to the connection portions by soldering.

7. The imaging apparatus according to claim 6, further comprising:
a hand shake compensation mechanism causing the imaging device unit to be moved in two directions perpendicular to each other in a plane parallel to the imaging surface,
wherein the heat radiating plate and the hand shake compensation mechanism being connected to each other, the imaging device unit being adapted to be moved in the two directions perpendicular to each other in the plane parallel to the imaging surface by causing the heat radiating plate to be moved by the hand shake compensation mechanism.

* * * * *